US006459634B1

United States Patent
Sher

(10) Patent No.: US 6,459,634 B1
(45) Date of Patent: Oct. 1, 2002

(54) CIRCUITS AND METHODS FOR TESTING MEMORY CELLS ALONG A PERIPHERY OF A MEMORY ARRAY

(75) Inventor: Joseph Sher, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/495,055

(22) Filed: Jan. 31, 2000

(51) Int. Cl.[7] .................................................. G11C 7/00
(52) U.S. Cl. ................. 365/201; 365/185.2; 365/189.07
(58) Field of Search ............................. 365/201, 185.2, 365/189.07

(56) References Cited

U.S. PATENT DOCUMENTS

| | | | | |
|---|---|---|---|---|
| 4,641,284 A | * | 2/1987 | Suzuki | 365/210 |
| 4,967,394 A | * | 10/1990 | Minagawa et al. | 365/201 |
| 5,142,496 A | * | 8/1992 | Van Buskirk | 365/201 |
| 5,184,326 A | | 2/1993 | Hoffman et al. | 365/201 |
| 5,214,604 A | * | 5/1993 | Kato | 365/210 |
| 5,297,079 A | * | 3/1994 | Ha | 365/182 |
| 5,315,554 A | * | 5/1994 | Nanba | 365/201 |
| 5,400,342 A | | 3/1995 | Matsumura et al. | 371/21.2 |
| 5,402,380 A | * | 3/1995 | Kumakura et al. | 365/210 |
| 5,420,822 A | * | 5/1995 | Kato et al. | 365/218 |
| 5,459,684 A | | 10/1995 | Nakamura et al. | 365/149 |
| 5,532,963 A | | 7/1996 | Kushiyama et al. | 365/201 |
| 5,657,284 A | | 8/1997 | Beffa | 365/201 |
| 5,848,010 A | | 12/1998 | Sher | 365/201 |
| 5,850,368 A | | 12/1998 | Ong et al. | 365/238.5 |
| 5,852,581 A | | 12/1998 | Beffa et al. | 365/201 |
| 5,862,072 A | | 1/1999 | Raad et al. | 365/63 |
| 6,031,773 A | * | 2/2000 | Taylor | 365/201 |
| 6,297,999 B2 | * | 10/2001 | Kato et al. | 365/201 |

* cited by examiner

Primary Examiner—Richard Elms
Assistant Examiner—Tuan T. Nguyen
(74) Attorney, Agent, or Firm—Howrey Simon Arnold & White, LLP

(57) ABSTRACT

A memory device comprising an array of memory cells includes test circuitry which is selectively configurable to interchangeably couple a dummy cell, which neighbors a memory cell at an edge of the array, to a select one of a plurality of different voltages. In a preferred embodiment, the test circuitry is configurable to selectively couple the dummy cell to one of an upper, lower or intermediate supply bus.

65 Claims, 11 Drawing Sheets

US 6,459,634 B1

CIRCUITS AND METHODS FOR TESTING MEMORY CELLS ALONG A PERIPHERY OF A MEMORY ARRAY

BACKGROUND OF THE INVENTION

The present invention relates to circuitry and methods for testing a memory device More particularly, the present invention provides circuitry and methods for testing memory cells of an edge of an array of memory cells.

Referring to FIG. 1, a known exemplary memory cell 102 comprises capacitor 104 and a transistor 108 coupled in series therewith as a switch for selectively accessing the capacitor. One plate, or electrode 101, of the capacitor is coupled to a common node. The other electrode 103 of the capacitor serves as a storage electrode for the memory cell. The transistor 108 typically comprises a MOSFET transistor and has its gateable channel electrically coupled between the storage electrode 103 of the capacitor and a bitline 106.

For a semiconductor memory device, e.g., a Dynamic Random Access Memory (DRAM), referencing FIGS. 2A, 2B, a plurality of memory cells 102 are arranged in rows and columns, e.g., as an x-y grid, to provide an array 200 of memory cells. Conductive bitlines 105, 106 extend a length of the array and connect bitline contacts 122 of respective columns. Wordlines 110 extend widths of the array and connect control terminals of the access transistors of their respective rows. Known address decode circuitry 109, 107 determines, in accordance with supplied address data, select bitlines and wordlines upon which to propagate data and enable signals respectively.

Further referencing FIGS. 2A, 2B, known decode circuitry 109 drives wordlines 110 in accordance with received address data. When activated by the decode circuitry, a wordline propagates an enable signal for enabling access transistors of its row of memory cells. Once the access transistors are enabled, data of the true or complementary bitlines 105, 106 respectively, is transferred provide data for transfer into capacitors of the memory cells of the selected row. Alternatively, during a read operation, data is transferred from the capacitors to the bitlines.

Within the present disclosure, the terms "one" and "zero" will refer to high and low data or logic levels respectively. Additionally, an enable signal may be thought of as enabling when active high. Notwithstanding the above, the present disclosure is deemed to encompass reverse or complementary perspectives thereof.

Further referencing FIGS. 2A, 2B, known sense amplifiers 114 sense and differentially amplify voltage levels of the true and complementary bitlines 105, 106 in accordance with data provided thereto. Know input/output buffers and column decoders 107 decode address data and propagate data upon select bitlines as determined by the address data. Known equilibration circuits 115 equilibrate the true and complementary bitlines 105, 106 to an equilibration bias level, i.e., of equilibration node 117, before the sense amplifiers are enabled. Equilibration node 117 is typically biased with the intermediate voltage level (e.g., DVC2). Known bus or supply circuitry distribute an upper voltage, e.g., $V_{CC}$, lower voltage, e.g., Ground, and the intermediate voltage, e.g., $V_{cc}/2$, about the memory device.

In normal operation, a high data level is stored within a memory cell by biasing a bitline with an upper logic level, e.g., $V_{cc}$, and activating a wordline 110 with an enable signal for enabling the memory cell's access transistor and transferring the upper voltage level ($V_{cc}$) of the bitline into the memory cell's storage electrode. Assuming an intermediate voltage bias at the common electrode 101 of, e.g., $V_{cc}2$, a positive voltage difference, e.g.,+$V_{cc}/2$, is provided for storage between the storage and common electrodes of the memory cell's capacitor 104. Thereafter, the wordline is deactivated for disabling the access transistor and isolating the storage electrode from the bitline. Likewise, a low data level may be stored within the memory cell using a similar procedure but with the bitline biased at the lower logic level, e.g., ground, during the write cycle, thereby providing a negative voltage difference, e.g.,–$V_{cc}/2$, between the storage and common electrodes of the capacitor.

It will be understood that the present description of a known exemplary dynamic random access memory (DRAM) and its operation is meant to provide a general understanding of a DRAM and is not meant to provide a complete description thereof.

Further referencing FIG. 2B, two separate storage node contacts at distal ends of active regions 120 are electrically coupled to the storage electrodes of respective memory cell capacitors. Accordingly, one of the cells employs one-half of active region 120 while the other, adjacent cell employs the other half of the active region. Two different row wordlines 110 overlap respective portions of active region 120 and form transistor gates thereover for controlling channels of their respective access transistors, which in turn enable selective coupling of the memory cell capacitors to a shared column bitline 105 (106) by way of a bitline contact 122 between the two wordlines.

FIG. 3 portrays, in simplified view, exemplary storage node electrodes of memory cell capacitors of a memory array. Wordlines 110 are schematically illustrated in order to facilitate an understanding of placements of the storage electrodes. During fabrication of the memory array, a defect 130 may result between adjacent capacitors, for example, between storage electrodes 132 and 134. It is theorized that such defect 130 could be caused, for example, by residual polysilicon particles settling between the electrodes during fabrication of the array. In schematic representation, referencing FIG. 4, defect 130 provides a resistive path between the storage electrodes 132, 134 of neighboring capacitors $104_A$ and $104_B$. Accordingly, data of a "one" level stored at capacitor $104_A$ might bleed-off and into a neighboring capacitor $104_B$ so as to potentially corrupt their data contents, assuming capacitor $104_B$ stores a "zero" level.

During the manufacture of semiconductor memory, known tests screen the memory for defects and assure quality of shipped product. For a memory device comprising, for example, a dynamic random access memory (DRAM), one known test comprises writing a checker-board pattern of data—e.g., alternating 1's and 0's—into memory cells of the array in order to check the cell-to-cell isolation between neighboring memory cells. U.S. Pat. No. 5,657, 284, entitled "Apparatus and Method for Testing Defects Between Memory Cells In Packaged Semiconductor Memory Devices," discloses one such exemplary test method that writes alternating "one" and "zero" data levels of the checkerboard test pattern into an array of memory cells. When writing, for example, a designated "one" cell, a high data level is applied to the storage electrode of the designated "one" cell for a duration sufficient to bring-out (or effect a current flow through) a potential short-circuit defect to an adjacent "zero" cell, i.e., of a zero data level. Checking the values of the adjacent "zero" cells after writing the designated "one" cell enables determination of potential cell-to-cell defects. U.S. Pat. No. 5,657,284 is assigned to the assignee of the present application and is incorporated herein by reference.

It is known to provide dummy cells around the periphery of a memory array in order to assist process uniformity during fabrication of the array of memory cells. Referencing FIG. 5, the known checkerboard pattern of test data within the array of memory cells stresses and tests the cell-to-cell isolation between inner cells of the array. However, memory cells at the periphery of the memory array receive stressing and testing relative to the inner cells of the array without significant testing external thereto. The known dummy cells of the exemplary prior art which neighbor a peripheral row of the array, have their wordline grounded (See FIG. 2B) to disable their associated access transistors (N-channel MOSFETs) and isolate the storage electrodes of the dummy cells from respective true or complementary bitlines 105, 106. Being isolated, the storage electrodes of the dummy cells are not able to receive full logic level, stress voltages for stressing the memory cells of the array's peripheral row.

Referencing FIG. 6, capacitor 202 of a dummy cell neighbors capacitor 104 of a periphery of memory array 200. Transistor 204 of the dummy cell has its channel electrically coupled between the storage electrode and an intermediate supply, e.g., of voltage DVC2, via bitline 203. Again, but with reference to this simplified schematic illustration of FIG. 6, the gate terminals of access transistors 204 of the exemplary prior art dummy cells adjacent a peripheral row of the memory array, are coupled to ground via wordline $R_{DC}$. With their gates grounded, access transistors 204 are biased in "OFF" states for isolating the storage electrodes of capacitors 202. Additionally, dummy cells adjacent a peripheral column of the array have their bitline 203 coupled to an intermediate voltage DVC2, so as to limit residual currents which might otherwise result from a defective dummy cell. With only an intermediate voltage bias available to these dummy cells, full "1"–"0" voltage levels are not available to the dummy cells for stressing memory cells of the peripheral column. Thus, memory cells of the array periphery are not able to be stressed to the same extent by which the array's inner cells may be subjected, which inner cells can be configured to achieve full "1"–"0" (i.e., $V_{cc}$–Ground) voltage differences therebetween.

What is needed, therefore, is a method of stressing and testing peripheral cells of a memory array. The present invention recognizes this need and proposes solutions thereto.

SUMMARY OF THE INVENTION

In accordance with an embodiment of the present invention, a memory device comprises an array of memory cells having at least one edge. Test circuitry is selectively configurable to interchangeably couple a dummy cell, which neighbors a memory cell at an edge of the array, to a select one of a plurality of different voltages. In a preferred embodiment, the test circuitry is configurable to selectively couple the dummy cell to one of an upper, lower or intermediate supply bus.

In accordance with another embodiment of the present invention, a method of testing a memory cell at an edge of an array comprises writing the edge memory cell with a first logic level. A dummy cell adjacent the edge memory cell is electrically biased with a voltage opposite that of the first logic level. Next, the memory cell is read and its contents compared to that previously written therein. Preferably, the dummy cell remains biased while the memory cell is read.

In a further exemplary embodiment of the present invention, edge-memory cells of a peripheral row are tested. Dummy cells are disposed adjacent the edge memory cells, and, in accordance with one aspect of this embodiment, share bitline contacts and bitlines in common with the edge memory cells. Data of first logic levels are written into the memory cells of the peripheral row while access transistors of the dummy cells remain disabled. Upon writing data into the peripheral row, the access transistors of the peripheral row are disabled. An enable signal is then provided to a dummy wordline for enabling access transistors of the dummy cells. Stress data is applied to the dummy cells of value opposite the first logic levels. Next, the access transistors of the dummy cells are disabled and data read from the memory cells of the peripheral row for comparison against that previously stored therein.

An alternative exemplary embodiment employs dummy cells adjacent a peripheral row of memory cells, which dummy cells and peripheral row of memory cells do not share bitlines and bitline contacts. Instead, the dummy cells employ contacts and bitlines separate those of the peripheral row. For this embodiment, bitlines drivers associated with the dummy cells are configured to drive respective bitlines with levels opposite the levels that were provided to the peripheral row of memory cells. A dummy wordline driver is configured to enable access transistors of the dummy cells so capacitors of the dummy cells receive the voltage level biasing of the bitlines. Preferably, the dummy cell capacitors remain coupled to the bitlines and continue to receive their bitline biasing while contents of the memory cells are read.

In accordance with another exemplary embodiment, memory cells of a peripheral column of an array are tested. Alternate pairs of wordlines are driven for simultaneously writing data from a shared bitline into each memory cell of the peripheral column. Others of the alternate pairs of wordlines are driven for enabling access transistors of the dummy cells while providing a voltage level opposite that which was provided to the peripheral column to a bitline of the dummy cells. Storage electrodes of the dummy cell capacitors receive the bias level of the dummy bitline for stressing regions between the dummy cells and memory cells of the peripheral column. Thereafter, data is read from the memory cells of the peripheral column for comparison against that previously stored therein. Preferably, the capacitors of the dummy cells remain coupled to the dummy bitline and continue to receive the stress biasing while the memory cells of the peripheral column are read.

These and other features of the present invention will become more fully apparent in the following description and independent claims, or may be learned by practice of the invention as set forth hereinafter.

BRIEF DESCRIPTION OF THE DRAWINGS

The present invention will be understood from reading descriptions of the particular embodiment with reference to specific embodiments illustrated in the intended drawings. Understanding that these drawings depict only exemplary embodiments of the invention and are not therefore to be considered limiting of its scope, the invention will be described and explained with additional detail through use of the accompanying drawings in which.

DETAILED DESCRIPTION OF THE PREFERRED EMBODIMENTS

Reference will now be made to drawings where like structures are provided like reference designations. The drawings are representative, non-limiting diagrams of select embodiments of the present invention and are not necessarily drawn to scale, which invention concerns methods for stressing and testing memory cells of a memory array of a semiconductor memory device such as a Dynamic Random Access Memory (DRAM).

The present invention provides improved voltage biasing capability to dummy cells around a memory array so that full "1"–"0" voltage magnitude differences can be established between the dummy cells and memory cells of the array's periphery. Accordingly, regions therebetween may be more fully stressed for screening defects which might otherwise remain concealed. In accordance with additional aspects of the present invention, the dummy cells can be provided nominal bias configurations once the peripheral cells have been tested, so as to isolate the dummy cell capacitors and provide the dummy bitlines voltages appropriate for minimizing any residual currents which might result from faulty dummy cells.

Figure 1:
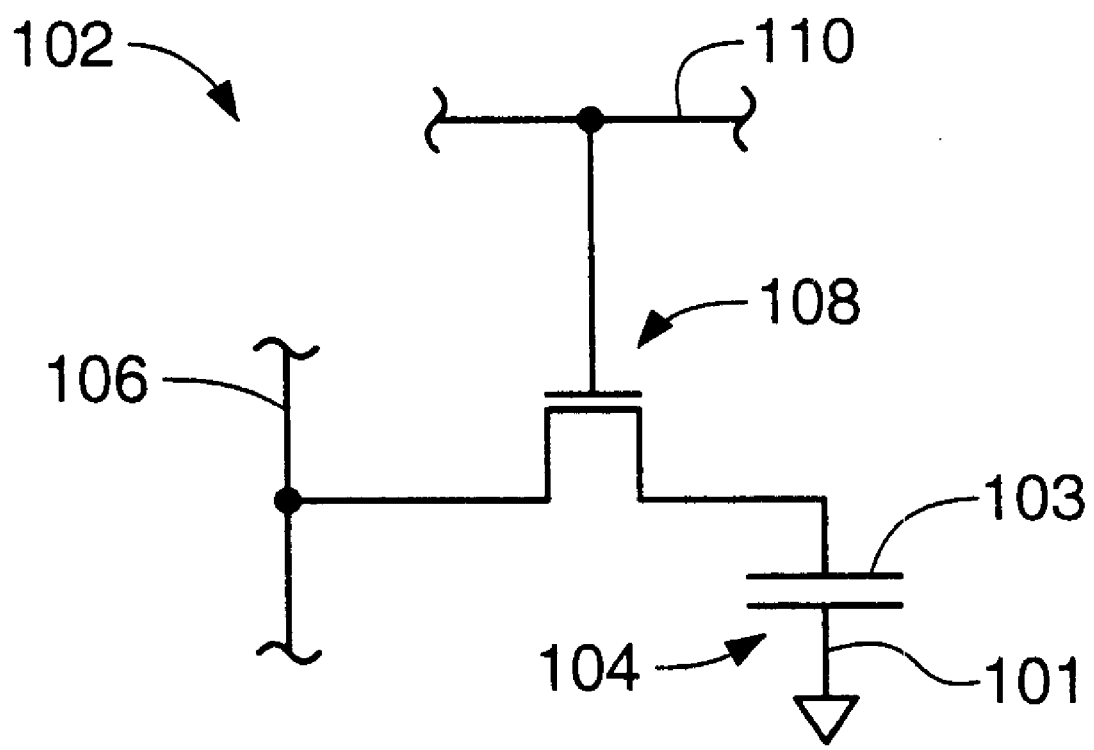
FIG. 1 is a schematic diagram of a known memory cell.
Figure 2A:
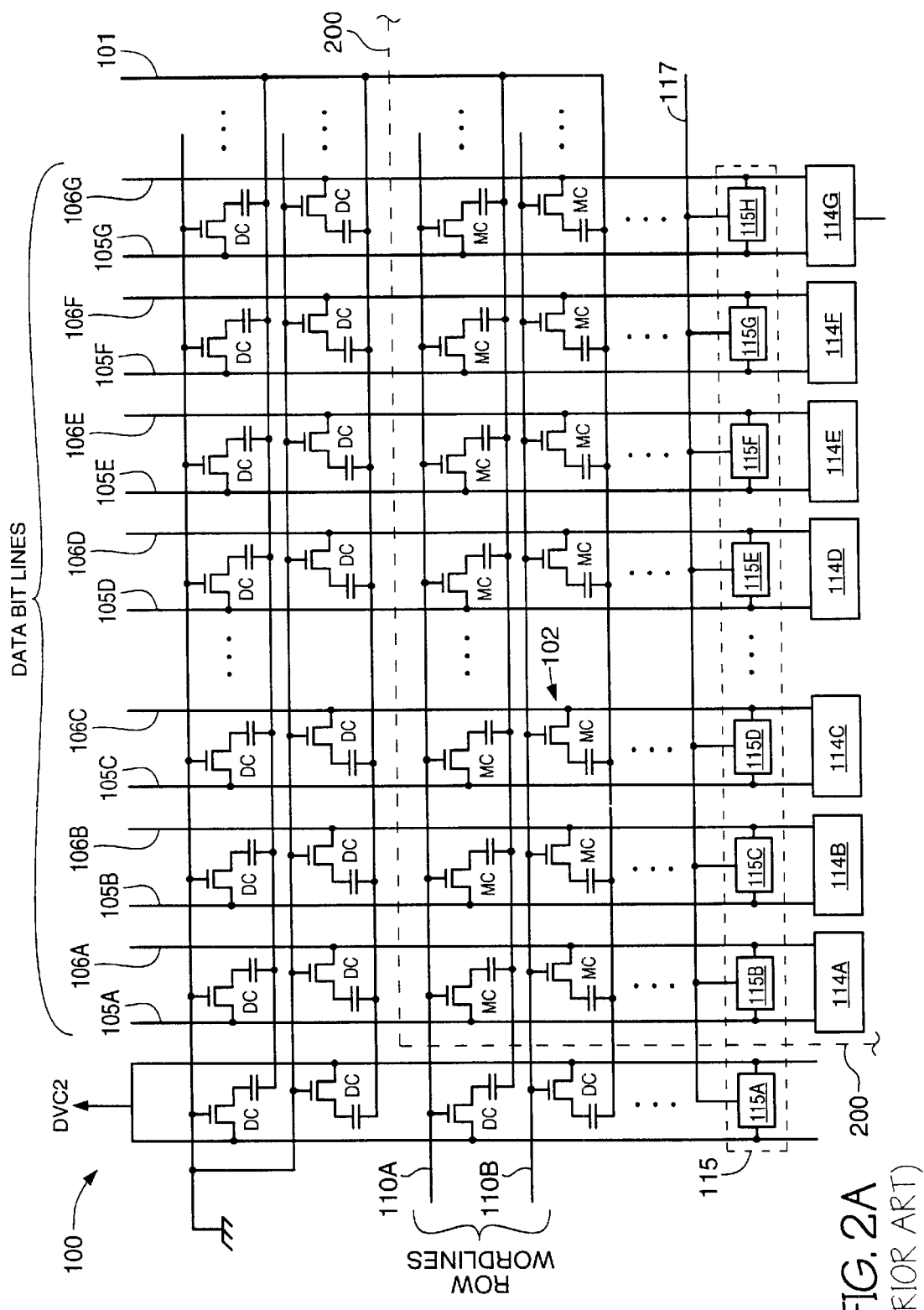
FIG. 2A is a simplified schematic representation of a portion of a prior art, memory array together with dummy cells adjacent a periphery of the array.
Figure 2B:
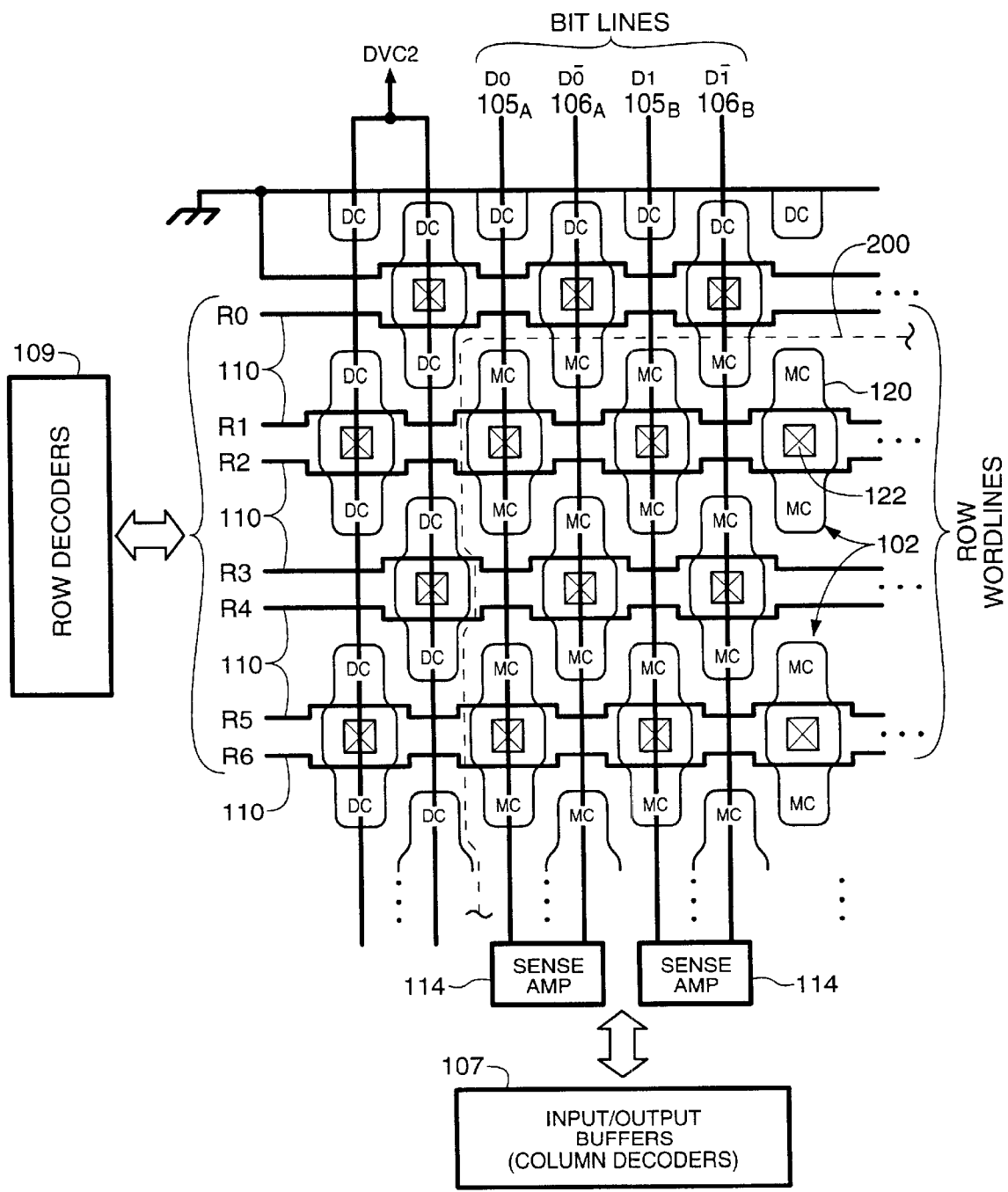
FIG. 2B is a representative, schematic plan view of a portion of a prior art memory device, portraying capacitors of a memory array and dummy cells adjacent thereto.
Figure 3:
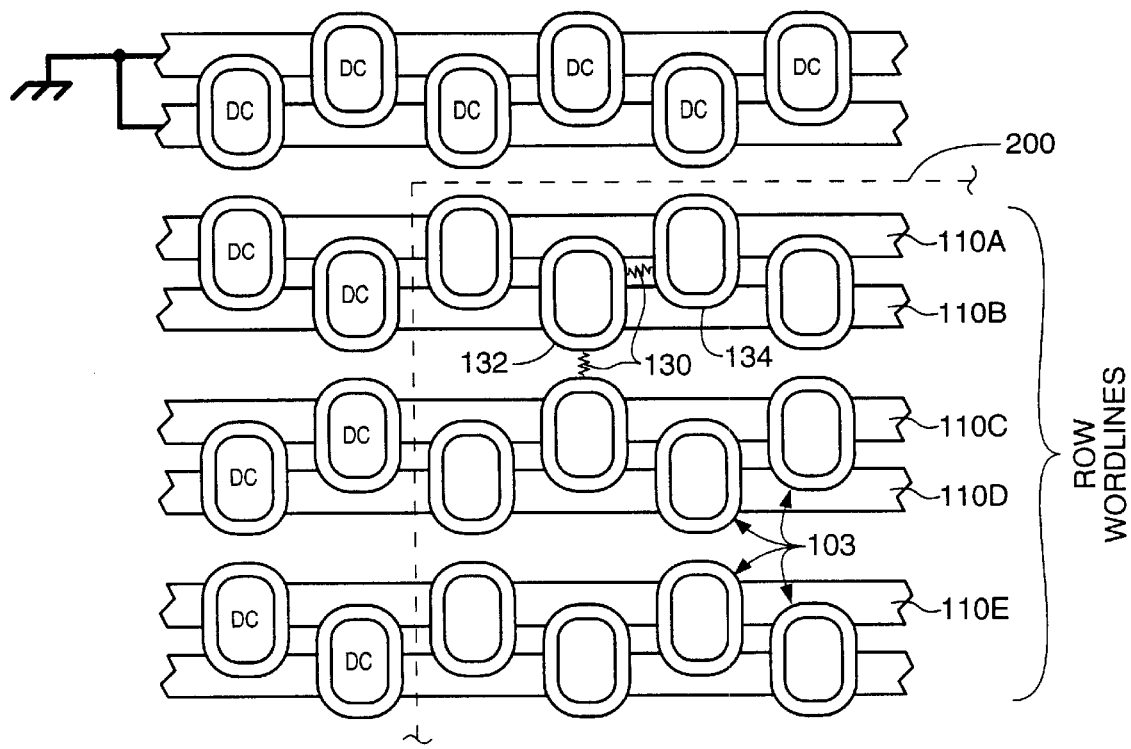
FIG. 3 is a partial, plan view of memory cells of a memory array and dummy cells adjacent thereto, illustrating potential short-circuit defects between inner memory cells of the array.
Figure 4:
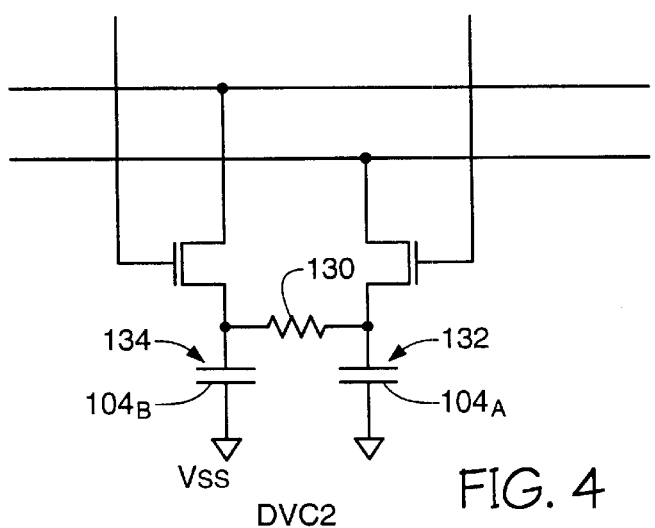
FIG. 4 is a schematic representation of a portion of a memory array, showing a cell-to-cell defect between capacitors of adjacent memory cells.
Figure 5:
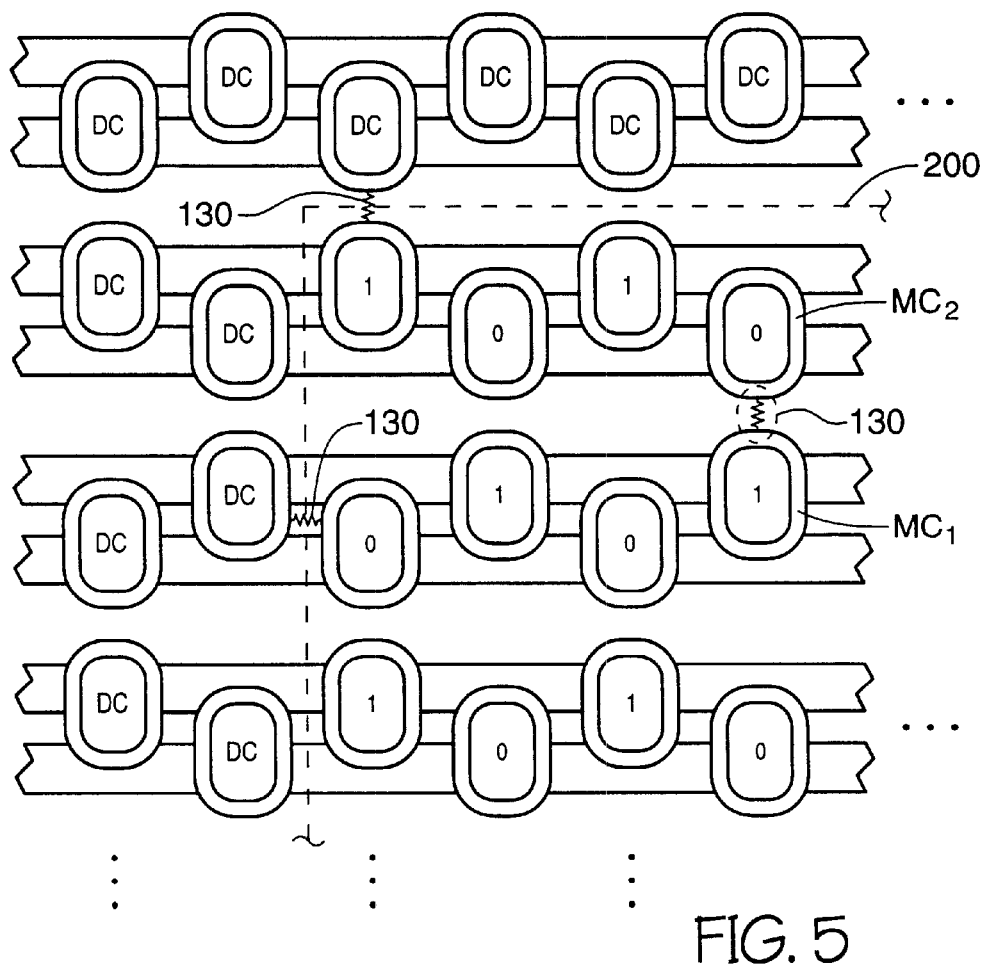
FIG. 5 is a representative, simplified plan view of an array of memory cells together with adjacent dummy cells, illustrating a known checker-board pattern of data within the array for testing the cell-to-cell isolation between inner cells of the memory array.
Figure 6:
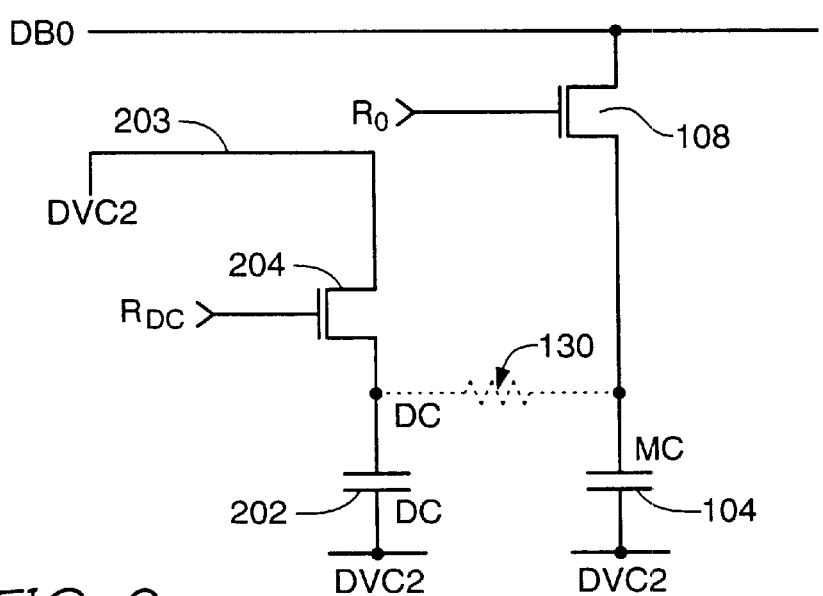
FIG. 6 is a schematic illustration of a memory cell at a periphery of an array and of a dummy cell adjacent the array, showing a possible cell-to-cell defect therebetween.
Figure 7A:
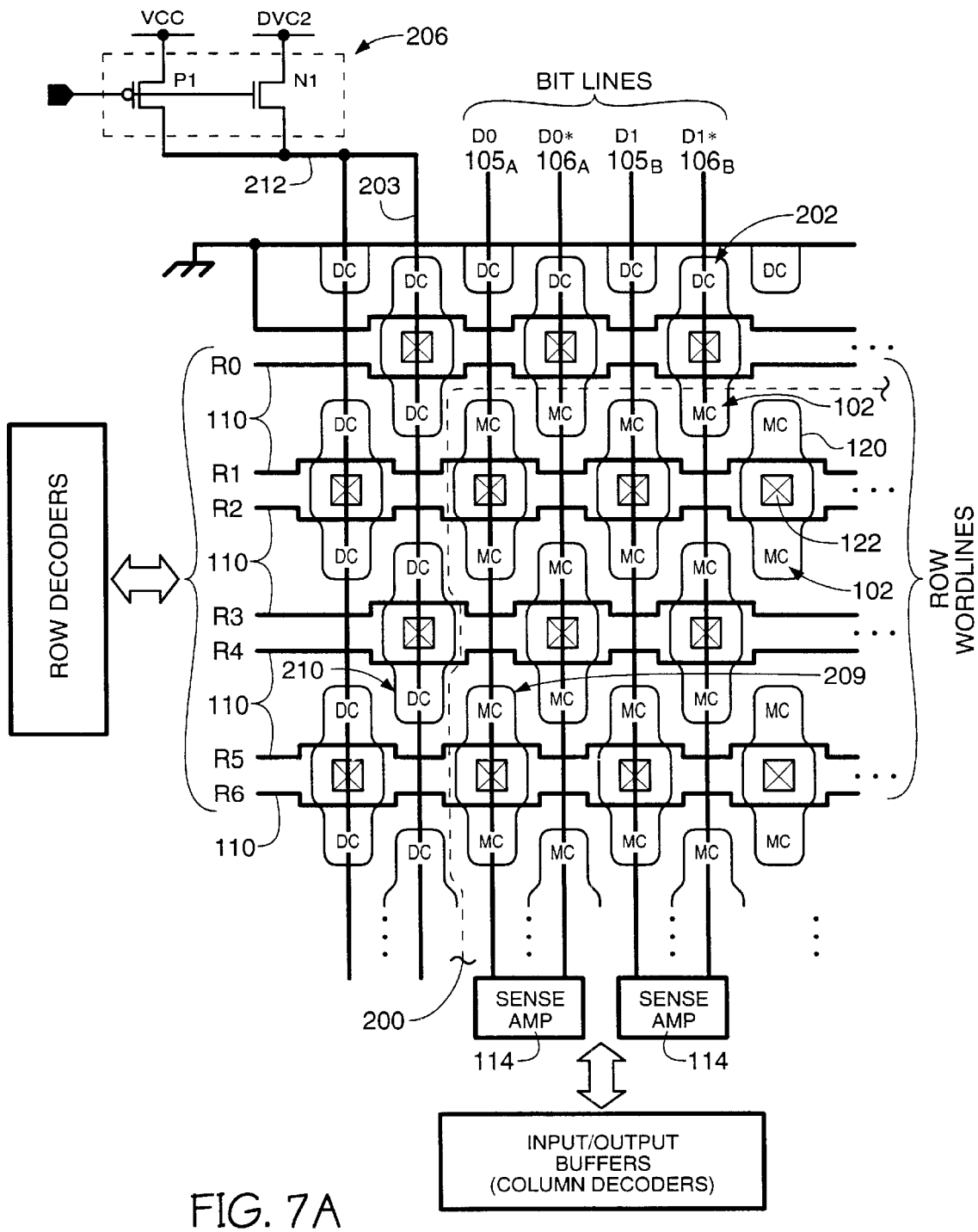
FIG. 7A is a simplified schematic and plan view of a portion of an array of memory cells together with adjacent dummy cells and test circuitry in accordance with an exemplary embodiment of the present invention.

In accordance with an exemplary embodiment of the present invention, with reference to FIG. 7A, selection circuitry 206 selectively couples bitline 203, which is associated with dummy cells adjacent a peripheral column of the array, to one of at least two different supplies. In accordance with one aspect of this exemplary embodiment, the two different supplies comprise an upper supply ($V_{cc}$) and an intermediate supply (DVC2). In accordance with an alternative aspect of this embodiment, the two different supplies comprises a lower supply (Ground) and an intermediate supply (DVC2).

Figure 7B:
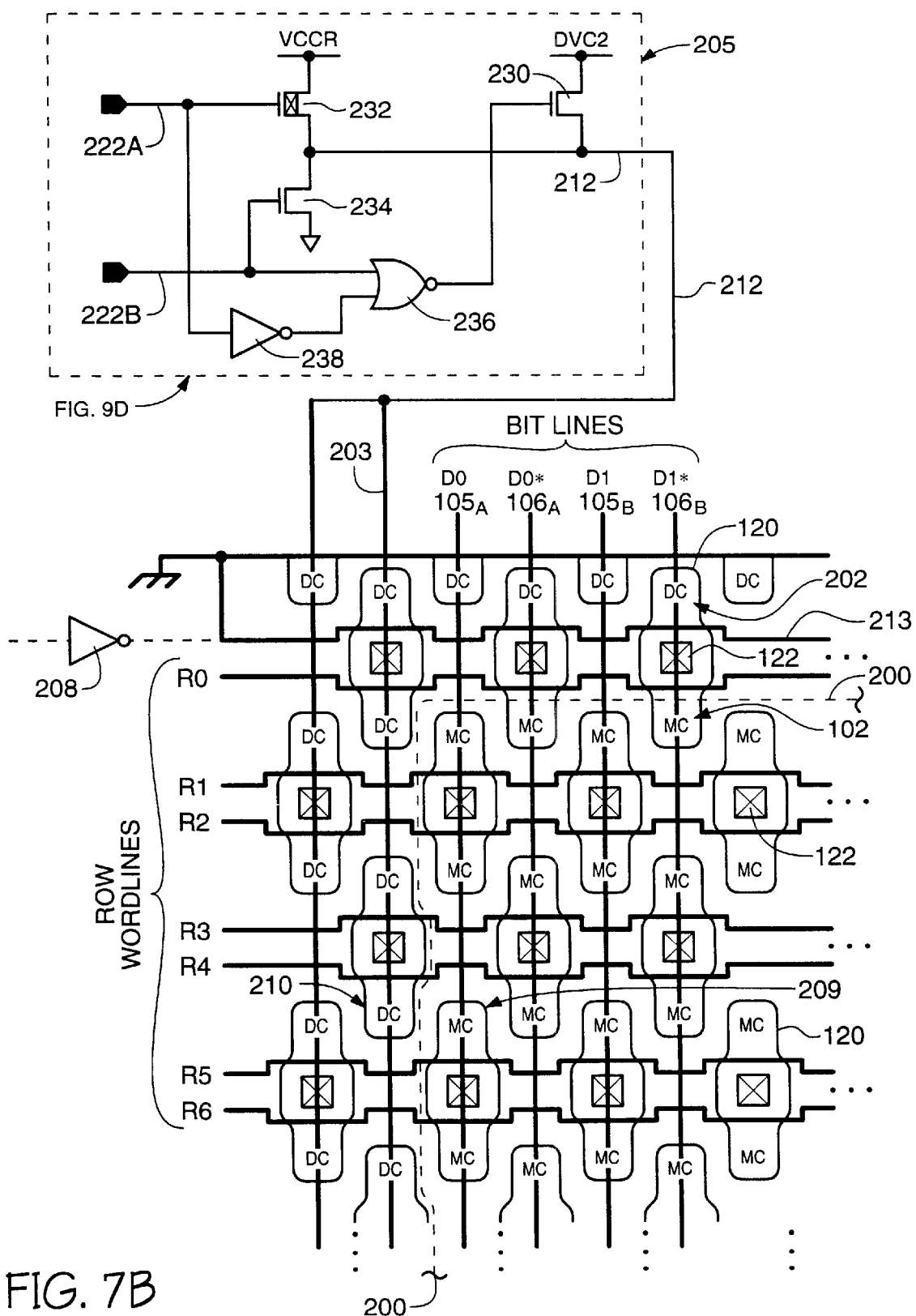
FIG. 7B is a simplified schematic and plan view of a portion of an array of memory cells together with adjacent dummy cells and test circuitry in accordance with an alternative exemplary embodiment of the present invention.

More preferably, referencing FIG. 7B, selection circuitry 205 selectively couples the bitline 203 of the dummy cells adjacent the peripheral column to one of three different supplies, e.g., an upper supply ($V_{cc}$), a lower supply (Ground), and an intermediate supply (DVC2). During normal memory operating conditions, selection circuitry 205 is configured to couple bitline 203 to the intermediate supply (DVC2). During a select test condition, selection circuitry couples bitline 203 to either one of the upper ($V_{cc}$) or lower (Ground) supplies.

In accordance with an alternative aspect of this exemplary embodiment of the present invention, further referencing FIG. 7B, wordline 213 is disconnected from ground and a driver 208 configured, as shown by phantom lines, for activating wordline 213 and enabling the transistors of the dummy cells adjacent the peripheral row for accessing the storage electrodes of the dummy cells' capacitors. With this accessibility, the cell-to-cell isolation may be tested between the memory cells of the peripheral row and the dummy cells adjacent thereto.

For the particular exemplary embodiment of FIG. 7B, the peripheral memory cells and adjacent dummy cells share active regions 120. Memory cells of the peripheral row of the array comprise inner portions of active regions 120 along the periphery of array 200, wherein wordline $R_0$ overlaps the inwardly facing portions of these active regions 120 between the memory cells' storage nodes and respective bitline contacts 122. The neighboring dummy cells 202, adjacent the peripheral row of the array, comprise outer portions of the shared active regions 120, wherein a dummy row wordline 213 overlaps the outwardly facing portions of the active regions between contacts of the dummy cell storage nodes and contacts 122 of the shared bitlines.

Figure 7C:
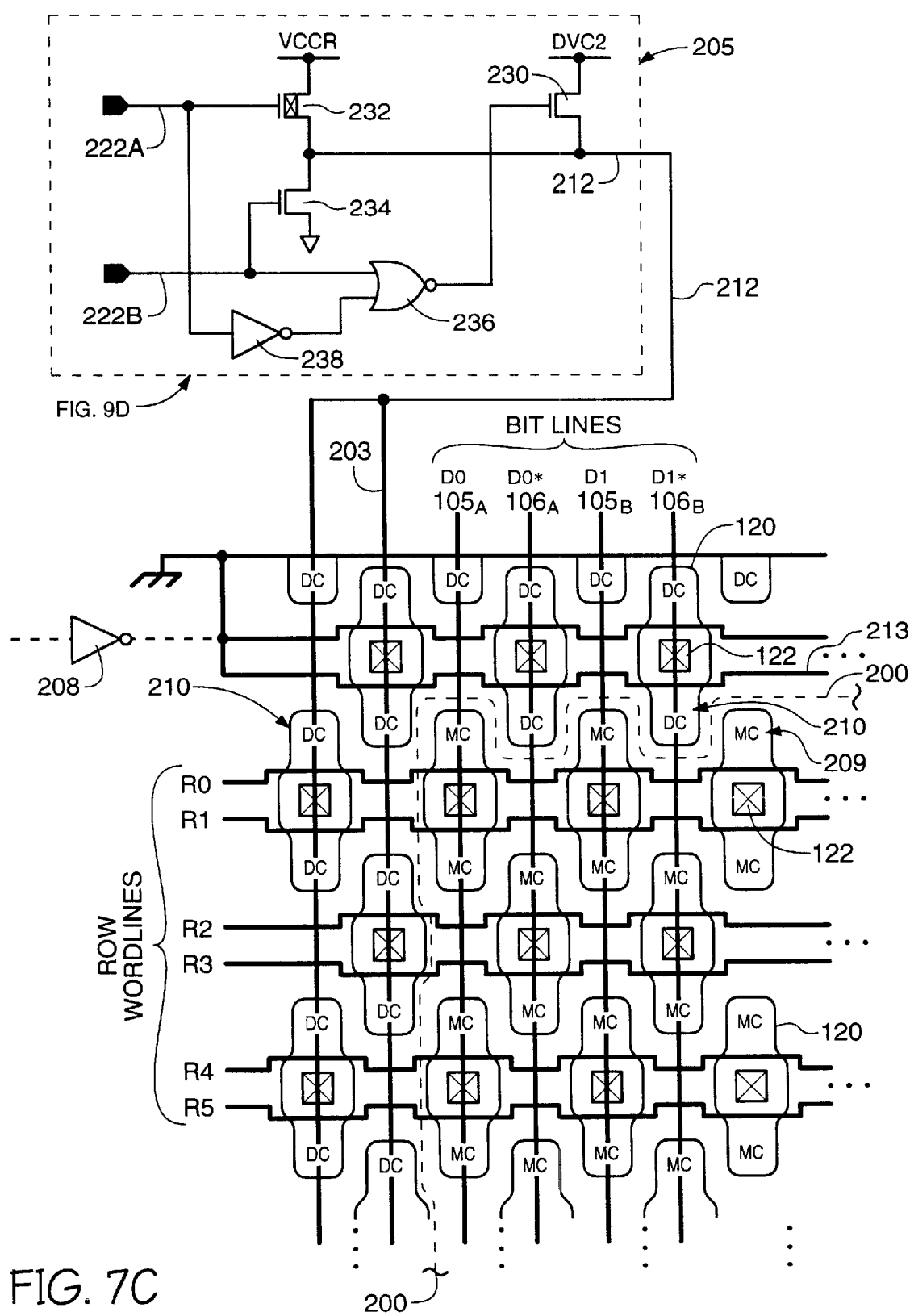
FIG. 7C is a simplified schematic and plan view of a portion of an array of memory cells together with adjacent dummy cells and test circuitry in accordance with another exemplary embodiment of the present invention.

In an alternative exemplary embodiment of the present invention, referencing FIG. 7C, the array periphery 200 is offset one row in relationship to the embodiment illustrated in FIG. 7B. For this alternative exemplary embodiment, dummy cells 210 employ active regions 120 separate from those of memory cells 209 of the peripheral row. Additionally, the dummy cells utilize bitlines 106 and bitline contacts 122 independent those of the peripheral row, and the first wordline RO of the array crosses active regions 120 separate from those of the adjacent dummy cells. Accordingly, memory cells of the peripheral row may be accessed independently from the dummy cells adjacent thereto. With independent accessibility, the dummy cells can receive sustained stress biasing while data is read from the peripheral row. This is more fully addressed subsequently herein.

Figure 9A:
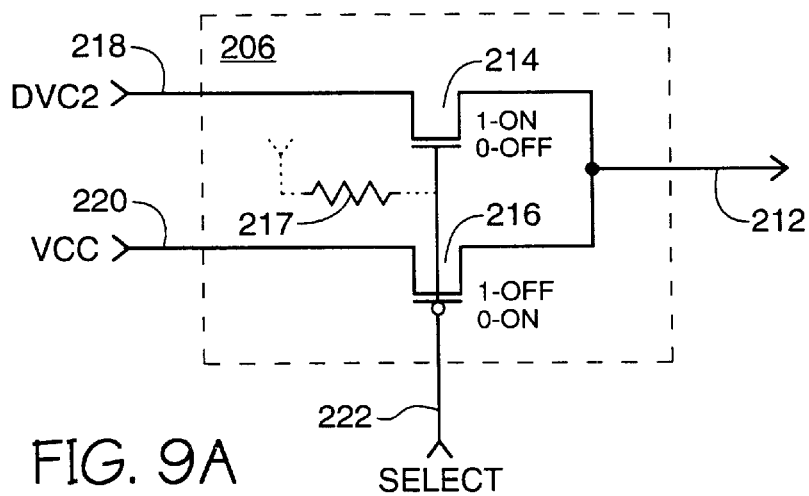
FIGS. 9A–9D are schematic diagrams of various dummy cell bias circuits in accordance with exemplary embodiments of the present invention.
Figure 9B:
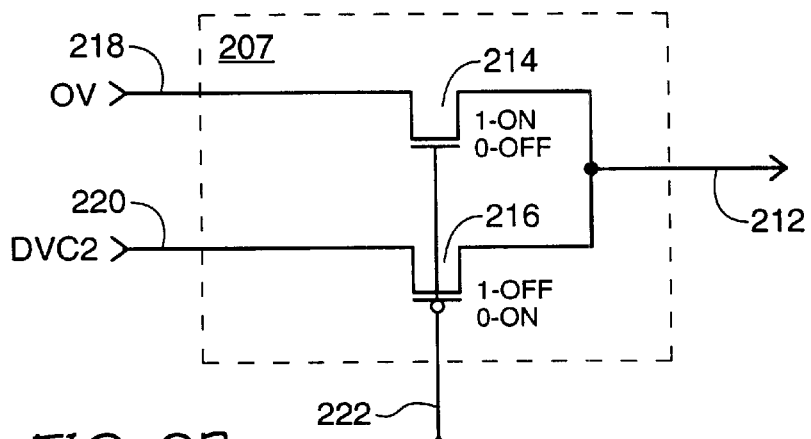

Referencing FIG. 9A, and in accordance with an exemplary embodiment of the present invention, selection circuitry 206 comprises N-channel and P-channel MOSFETs 214, 216 coupled between output 212 and two separate supply inputs 218 and 220 respectively. Control node 222 is coupled to the MOSFET gates and controls activation of transistors 214, 216. A high level at control node 222 disables P-channel MOSFET 216 and enables N-channel MOSFET 214 for coupling supply input 218, for example, DVC2, to output 212. Alternatively, a low-level at control node 222 disables the N-channel MOSFET 214 and enables P-channel MOSFET 216 for coupling supply input 220, for example, an upper supply $V_{cc}$, to output 212. In an alternative aspect of this exemplary embodiment, a known pull-up or pull-down resistor 217 is attached electrically between control node 222 and one of an upper or lower supply for establishing a default configuration in the absence of a control signal. FIG. 9B illustrates an alternative bias configuration for selection circuitry 207 which operates similarly to selection circuitry 206 of FIG. 9A except for the use of alternative supplies.

Figure 9C:
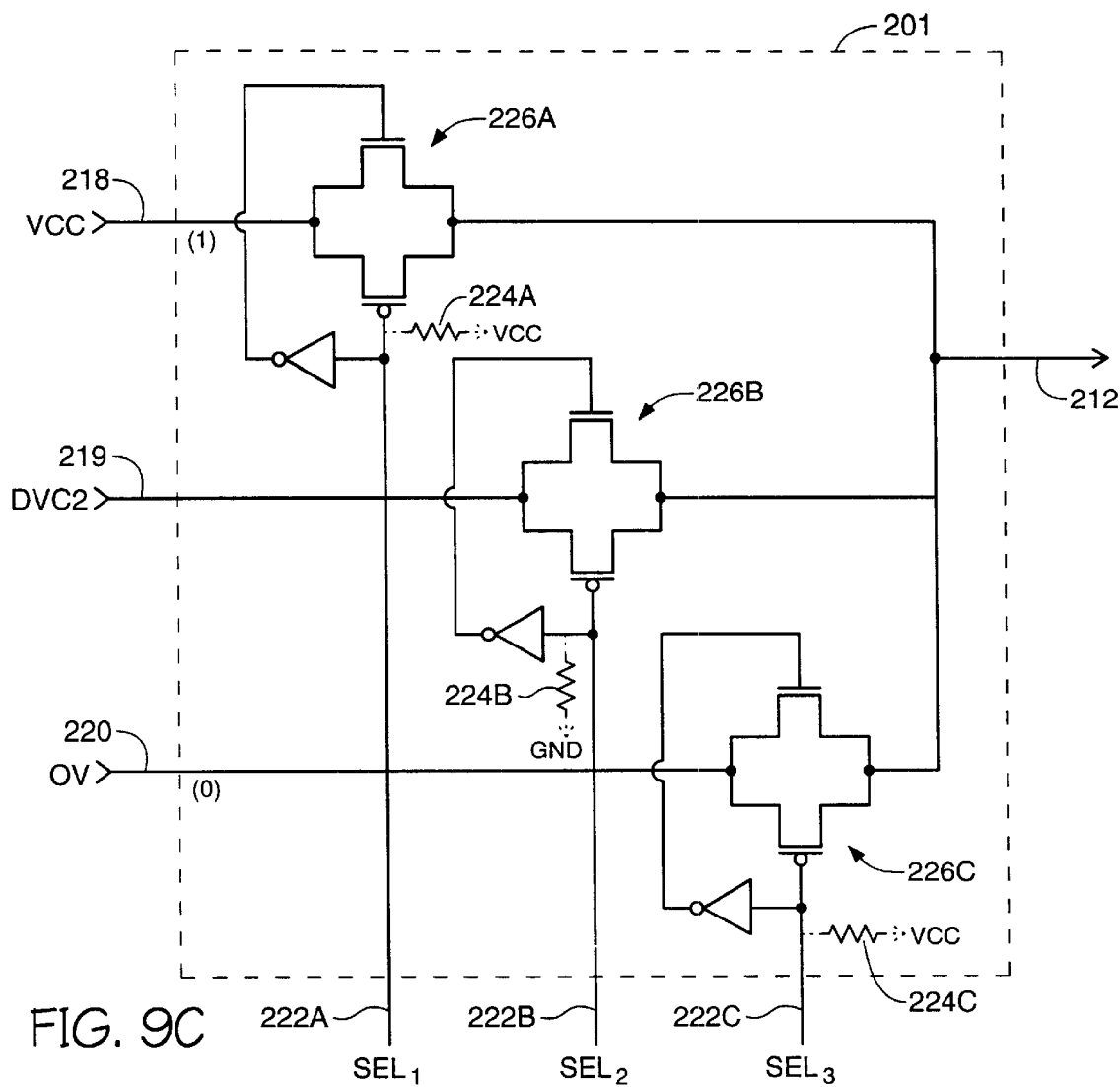

In accordance with yet another embodiment of the present invention, with reference to FIG. 9C, selection circuitry 201 comprises three pass-gates 226A, 226B, 226C coupled between output 212 and respective inputs 218, 219, 220, of different supplies, e.g., $V_{cc}$, DVC2, and Ground respectively. Control nodes 222A, 222B, 222C drive the gates of respective pass-gates. Optional pull-up and pull-down resistors 224A, 224B, 224C can be coupled to respective control nodes for establishing a default configuration for the selection circuit in the absence of control signals.

Figure 9D:
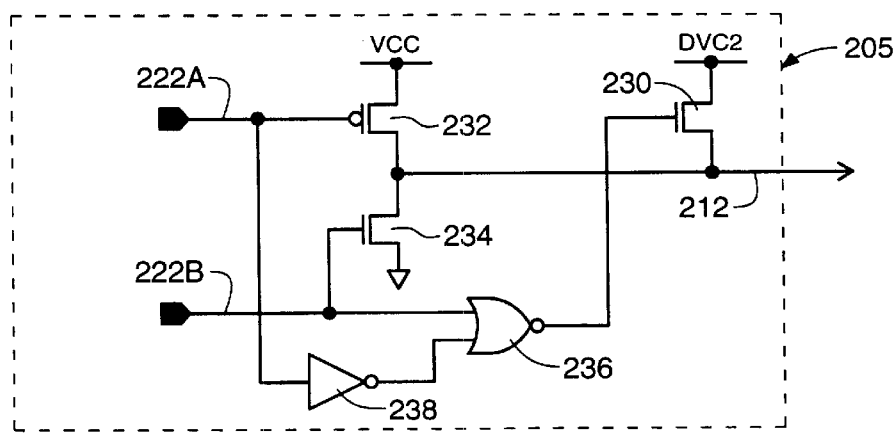

In accordance with a preferred embodiment of the present invention, with reference to FIG. 9D, selection circuitry 205 comprises decode logic and three MOSFET devices. P-channel MOSFET 232 has its channel coupled between output 212 and an upper supply ($V_{cc}$). N-channel MOSFET 234 has its channel coupled between output 212 and a lower supply (ground). N-channel MOSFET 230 has its channel coupled between output 212 and an intermediate supply (DVC2). The gate of MOSFET 230 is driven by the output of NOR logic device 236. One input of NOR logic device 236 is coupled to a first control node 222A by way of inverter 238, while the second input of the NOR logic device 236 is coupled to the second control node 222B.

In a first edge test mode, first and second control inputs 222A, 222B receive low logic levels for enabling the P-channel MOSFET 232 and disabling MOSFETs 234, 230. Accordingly, output 212 of selection circuitry 206 is coupled to the upper supply, for example, $V_{cc}$, by way of P-channel MOSFET 232. In a second edge test mode, the first and second control inputs 222A, 222B receive high logic levels for enabling N-channel MOSFET 234 and disabling MOSFETs 232, 230 for coupling output 212 to the lower supply, for example, ground. In a third, or normal, operating mode, the first control input 222A receives a high level and the second control input 222B a low level for enabling N-channel MOSFET 230 via logic devices 236, 238 and disabling MOSFETS 232, 234, thereby coupling output 212 to the intermediate supply, for example, DVC2.

For the various embodiments described above, the selection circuitry utilized for biasing the bitline of the dummy cells adjacent the peripheral column of the array comprised switching circuits (e.g., 201, 205, 206, 207) operatively configurable to couple the bitline to one of a plurality of different supplies. It is understood that the present invention encompasses alternative stress biasing circuits or configurations for the selection circuits, wherein the selection circuits are interchanged or replaced with other programmable voltage or multiplexing circuits.

Returning to FIG. 8, capacitor 202 of a dummy cell neighbors capacitor 104 of a memory cell from a periphery of an array. Wordline 208 is coupled to the gate of access transistor 204 which controls coupling between the storage node of capacitor 202 and a dummy bitline 203. Selection circuitry 206 selectively couples dummy bitline 203 to one of an upper or lower supply voltage, or alternatively, to an intermediate voltage DVC2, as determined in accordance with control signals received at terminal 222.

Figure 8:
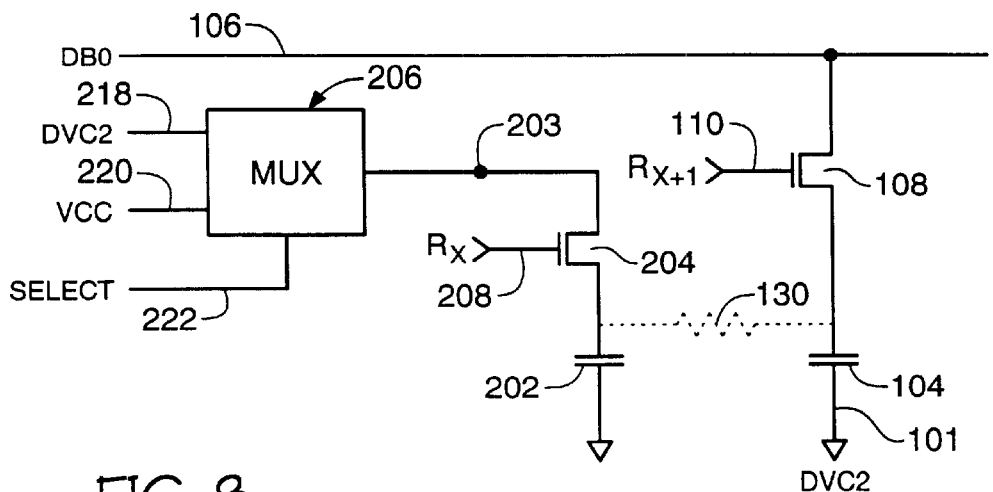
FIG. 8 is a schematic diagram illustrating exemplary circuitry of the present invention for stressing or testing memory cells of a periphery of a memory array.

During a test procedure, further referencing FIG. 8, a 1 (or 0) data value is written into the edge memory cell by providing a high (or low) logic level to bitline 106 and enabling access transistor 108 for a duration sufficient to charge the storage node of capacitor 104. Next, a different logic level opposite that which was provided to capacitor 104, is applied to dummy bitline 203, and access transistor 204 enabled by activating dummy wordline 208. Accordingly, the storage node of the dummy cell's capacitor 202 is coupled to the dummy bitline 203 for receiving the stress voltage of opposite logic level. Dummy wordline 208 and access transistor 204 preferably remain activated and enabled for a duration sufficient to stress a potential defect that may exist between the capacitor 104 of the edge memory cell and the capacitor 202 of the dummy cell. If a defect 130 exists between the storage node of the dummy cell's capacitor 202 and the storage node of the memory cell's capacitor 104, the charged state of the memory cell's capacitor can be corrupted by the stress voltage of the adjacent dummy cell, which can be determined by reading the memory cell and comparing its contents to the data previously written therein.

Figure 10:
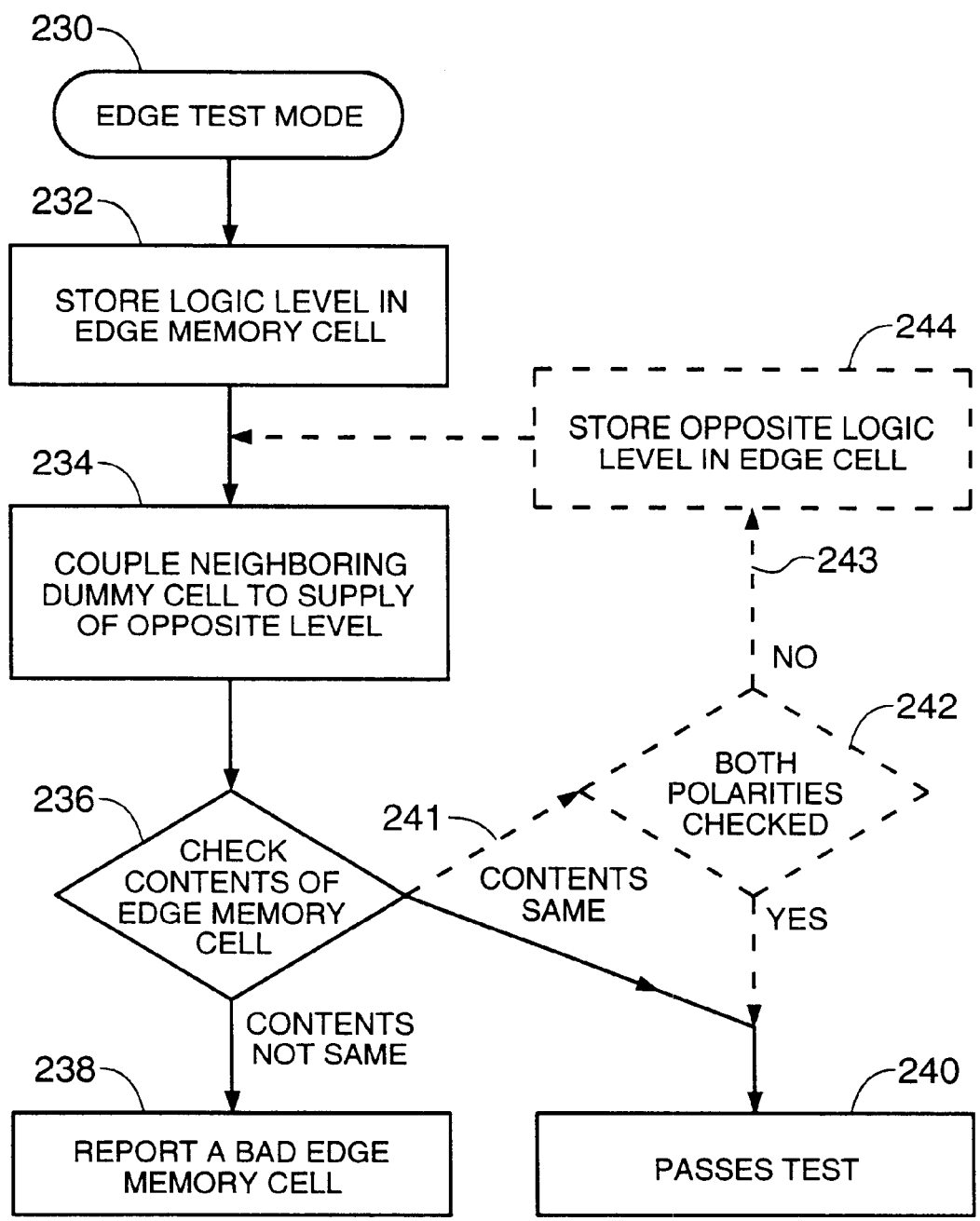
FIG. 10 is simplified flow chart showing exemplary methods of the present invention for testing memory cells of a memory array.

Referencing the flow chart of FIG. 10, and further referencing the schematic diagrams of FIGS. 7A and 8, an edge test mode is first initiated at step 230 of FIG. 10, followed by writing 232 a 1, or 0, data level into a peripheral memory cell 209 at an edge of memory array 200. A dummy cell 210 adjacent the peripheral memory cell 209 is coupled 234 to a supply of a voltage level opposite that of the 1 (or 0) data level that was previously written into memory cell 209. Next, the peripheral memory cell 209 is read and its contents compared 236 to data previously written therein. If the contents correspond to the data previously written therein, a pass condition is reported 240. If the contents have changed, a failure is reported 238. As mentioned earlier herein, relative the embodiment of FIG. 7C wherein the dummy cell and memory cell employ separate bitlines and bitline contacts, preferably, the storage node electrode of the dummy cell's capacitor 210 remains coupled to the voltage of opposite logic level, during the step of reading the memory cell so as to continue stressing the memory cell during the step of reading its contents.

In accordance with a further aspect of this exemplary embodiment, the test is performed again with signals of opposite polarity. In step 244 (following the dashed-lines 241, 243 of FIG. 10), second data of a level opposite the first is written into the edge memory cell 209. Selection circuitry biases dummy bitline 203 with a level opposite the second data and the access transistor of the dummy cell enabled for coupling the dummy cell's capacitor to dummy bitline 203. Again, the edge memory cell is read and its contents examined 236 for determining a possible defect. Upon completing the test, the selection circuitry is configured to couple dummy bitline 203 to an intermediate supply (DVC2), i.e., a desired bias condition for the dummy bitline during normal operation of the memory array.

This firstly described exemplary method of stress testing stresses memory cells of a peripheral column of a memory array. The dummy cells neighboring the peripheral column are associated with active regions 120 separate from the active regions for memory cells of the peripheral column. Accordingly, this particular method of stress testing the peripheral column targets potential short-circuit defects that may exist across field-oxide and/or isolation regions between respective active regions of the memory and dummy cells.

Shifting away from a peripheral column, two alternative methods are now described for testing a peripheral row of the memory array. In a first method, it is assumed that memory cells of the peripheral row share active regions 120 with the adjacent dummy cells, as illustrated in FIG. 7B. Bitlines 106 associated with the peripheral row receive first data for storage into memory cells 102 of the peripheral row. Wordline $R_0$ of the peripheral row receives a write signal for enabling the row of access transistors and writing data of bitlines 106 into the capacitors of the memory cells. Next, bitlines 106 are provided data of levels opposite that of the first data. A row driver 208, referencing FIG. 7B, is configured to drive wordline 213 associated with the adjacent row of dummy cells 202 for enabling the access transistors thereof and for charging storage electrodes of their capacitors with the bitline data. After writing the dummy cells with the data of levels opposite that of the peripheral row, row driver 208 provides a signal for disabling the access transistors of the dummy cells so as to isolate the dummy cells from bitlines 106 which bitlines 106 are shared with the memory cells 102 of the peripheral row. Memory cells 102 of the peripheral row are then read and their contents examined for identifying cells having changed contents.

A second alternative method for testing a peripheral row, referencing FIG. 7C, assumes that the peripheral row of memory cells 209 reside on active regions 120 separate the active regions of dummy cells 210. For such embodiment, dummy cells 210 employ bitline contacts 122 and bitlines 106 different from those associated with the peripheral row. After writing data into memory cells 209 of the peripheral row, complementary data is written into dummy cells 210 adjacent the peripheral row. Employing bitlines 106 separate from bitlines 105 of the memory cells of the peripheral row, dummy cells 210 may have their access transistors enabled for keeping the capacitors of the dummy cell coupled to the stress voltage for continuing to stress the memory cells of the peripheral row while the contents of the peripheral row are read.

Another exemplary embodiment of the present invention, with reference to FIG. 7A, takes advantage of a particular characteristic of an array architecture, wherein memory cells of a peripheral column of the array can be accessed by activating alternating pairs of wordlines, e.g. R1–R2, R5–R6, R9–R10 . . . while dummy cells of a column adjacent the peripheral column are accessed by activating the other pairs of alternating pairs of wordlines, e.g. R0, R3–R4, R7–R8 . . . Alternating pairs of wordlines for the peripheral column are enabled while applying a first data level to bitline 105 of the peripheral column so as to simultaneously write the first data level into the memory cells of the peripheral column. Next, the other pairs of the alternating pairs of wordlines are activated and bitline 203 of the dummy cells provided a stress voltage level more proximate a voltage level corresponding to the complement of the first data level than that of the first data level. In other words, the storage node electrodes of the dummy cell capacitors are provided a high (or low) voltage level suitable for stressing potential defects that may reside between the memory cells of the peripheral column and the dummy cells adjacent thereto. Next, memory cells of the peripheral column are read for checking their data retention capabilities. Those whose contents have changed are identified as defective. In a further alternative embodiment, all wordlines associated with the peripheral column remain simultaneously activated while checking the current drawn by the bitline of the peripheral column for determining a fail or pass condition in accordance with the magnitude of the drawn current.

After stressing and testing the peripheral memory cells of the memory array, the memory device is configured for normal operation. In one such exemplary, normal configuration, a dummy wordline is coupled to ground or receives a disable signal, e.g., a low level signal by way of driver 208 of FIG. 7B, for disabling the access transistors of the dummy cells adjacent a peripheral row of the memory array. Additionally, selection circuitry 205 is configured to provide an intermediate voltage—e.g., $V_{cc}/2$—to a digit line 203 that is associated with the dummy cells adjacent a peripheral column of the array. The intermediate voltage bias and disabled access transistors aim to minimize currents which might otherwise result from a defect associated with a dummy cell adjacent the periphery of the memory array.

Accordingly, the present invention provides new circuits and methods for testing and stressing the edge memory cells of a memory array. Although the forgoing invention has been described with respect to certain exemplary embodiments, other embodiments will become apparent in view of the disclosure herein. Accordingly, the described embodiments are to be considered only as illustrative and not restrictive. The scope of the present invention, therefore, is indicated by the dependent claims and their combination in whole or in part rather than by the foregoing description. All changes thereto which come within the meaning and range of the equivalent of the claims are to be embraced within the scope of the claims.

What is claimed is:

1. A memory device comprising:
an array of memory cells disposed in rows and columns, the array having at least one edge;
at least one dummy cell neighboring a memory cell at the edge of the array, the dummy cell comprising a transistor; and
test circuitry to couple the dummy cell to one of three different voltages through the transistor.

2. A memory device according to claim 1, wherein:
the one of three different voltages is selected from the group consisting of: an upper voltage, an intermediate voltage, and a lower voltage.

3. A memory device according to claim 1, wherein:
each of the memory and dummy cells comprises a capacitor having a plate electrode and a storage electrode, and the test circuitry comprises a multiplexer.

4. A memory device according to claim 3, wherein the multiplexer comprises a first gateable channel electrically coupled between the storage electrode of the dummy cell and an upper voltage bus.

5. A memory device according to claim 4, wherein the multiplexer further comprises a second gateable channel electrically coupled between the storage electrode of the dummy cell and an intermediate voltage bus.

6. A memory device according to claim 5, further comprising a controller to enable one of the first and second gateable channels.

7. A memory device according to claim 3, wherein the multiplexer comprises a first transistor having a channel electrically in series between the storage electrode of the dummy cell and a lower voltage bus.

8. A memory device according to claim 7, wherein the multiplexer further comprises a second transistor having a channel electrically in series between the storage electrode of the dummy cell and an intermediate voltage bus.

9. A memory device according to claim 8, further comprising a controller to enable one of the first and second transistors.

10. A memory integrated circuit having a plurality of memory cells arranged in an array of columns and rows, wherein the memory integrated circuit is operable in a test mode, the memory integrated circuit further comprising:

stress circuitry operable only in the test mode to provide one of three different voltages to a region outside the memory array adjacent to an edge memory cell of the memory array.

11. A memory integrated circuit according to claim 10, wherein the stress circuitry comprises:
   a dummy cell adjacent the edge memory cell and outside the memory array; and
   selection circuitry to selectively couple the dummy cell to one of the three different voltages.

12. The memory integrated circuit of claim 11, wherein the one of the three different voltages is selected from the group consisting of: an upper voltage, an intermediate voltage, and a lower voltage.

13. A memory integrated circuit according to claim 10, wherein the stress circuitry comprises:
   a plurality of dummy cells adjacent a periphery of the array; and
   selection circuitry to selectively couple at least one of the dummy cells to one of the three different voltages.

14. The memory integrated circuit of claim 13, wherein the one of the three different voltages is selected from the group consisting of: an upper voltage, an intermediate voltage, and a lower voltage.

15. A memory integrated circuit according to claim 10, wherein the stress circuitry comprises:
   a dummy cell having a storage electrode, a plate electrode and a dielectric between the electrodes, the dummy cell disposed next to the edge memory cell;
   a first gateable circuit coupled between the storage electrode and a first voltage bus; and
   a second gateable circuit coupled between the storage electrode and a second voltage bus.

16. A memory integrated circuit according to claim 15, wherein the first gateable circuit comprises a MOSFET arrangement having its channel electrically coupled between the dummy cell and the first voltage bus, and the second gateable circuit comprises a MOSFET arrangement having its channel electrically coupled between the dummy cell and the second voltage bus.

17. A memory integrated circuit according to claim 16, wherein one of the MOSFET arrangements comprises an N-channel device and a P-channel device, the gates of the devices operating as a common control node.

18. A memory integrated circuit according to claim 15, wherein at least one of the first and second gateable circuits comprises:
   an N-channel MOSFET having its channel electrically coupled between the dummy cell and one of the first and second voltage buses;
   a P-channel MOSFET having its channel electrically coupled in parallel with that of the N-channel MOSFET;
   an inverter having an input and an output, the inverter electrically coupled between the gates of the MOSFETs; and
   a control node electrically coupled to the input of the inverter.

19. A DRAM comprising:
   an array of memory cells;
   a dummy cell outside the array and next to a peripheral memory cell of the array, the dummy cell comprising a transistor; and
   selection circuitry to electrically charge the dummy cell to one of three different voltages, said charging taking place through the transistor.

20. The memory integrated circuit of claim 19, wherein one of the three different voltages is selected from the group consisting of: an upper voltage, an intermediate voltage, and a lower voltage.

21. A DRAM according to claim 19, wherein
   the dummy cell comprises first and second electrodes separated by a dielectric, and
   each of the memory cells comprises first and second electrodes separated by a dielectric, the second electrodes of the memory cells and the second electrode of the dummy cell being electrically coupled.

22. A DRAM according to claim 21, wherein the selection circuitry comprises:
   a first gateable circuit coupled between the first electrode of the dummy cell and a first voltage bus; and
   a second gateable circuit coupled between the first electrode of the dummy cell and a second voltage bus.

23. A DRAM according to claim 21, wherein the three different voltages are selected from the group consisting of: an upper voltage, a lower voltage, and an intermediate voltage.

24. A DRAM according to claim 21, wherein the selection circuitry comprises:
   a first gateable circuit coupled between the first electrode of the dummy cell and one of an upper voltage bus and a lower voltage bus; and
   a second gateable circuit coupled between the first electrode of the dummy cell and an intermediate voltage bus.

25. A DRAM according to claim 21, wherein the selection circuitry comprises:
   a first gateable circuit coupled between the first electrode of the dummy cell and a lower voltage bus; and
   a second gateable circuit coupled between the first electrode of the dummy cell and an upper voltage bus; and
   a third gateable circuit coupled between the first electrode of the dummy cell and an intermediate voltage bus.

26. A DRAM according to claim 25, further comprising control circuitry to enable select one of the first, second, and third gateable circuits.

27. A method of testing a memory device comprising an array of memory cells, comprising:
   writing a logic level into at least one peripheral memory cell along an edge of the array; and
   coupling a dummy cell on a dummy column outside the array and adjacent the peripheral memory cell to a voltage closer to the compliment of the logic level than to the logic level.

28. The method of claim 27, further comprising:
   reading a value of the peripheral memory cell; and
   comparing the value read to the logic level.

29. A method of testing a memory cell at an edge of a memory array, comprising:
   writing a first logic level to the memory cell; and
   enabling a selection circuit to provide one of three voltages to a dummy cell adjacent the memory cell through a transistor of the dummy cell.

30. The method of claim 29, further comprising:
   reading the memory cell; and
   comparing a value read from the memory cell to the first logic level.

31. A method according to claim 29, wherein the voltage provided to the dummy cell is a complement of the first logic level.

32. A method according to claim 29, further comprising:
writing a second logic level to the memory cell that is the compliment of the first logic level; and
enabling the selection circuit to provide a complement of the second logic level to the dummy cell through a transistor of the dummy cell.

33. A method according to claim 32, further comprising:
reading the memory cell to obtain a second value; and
comparing the second value to the second logic level.

34. A method of testing a memory device having an array of memory cells, comprising:
writing a 0 or 1 logic level to a peripheral memory cell of the array; and
applying a stress voltage of level more proximate the compliment of the written 0 or 1 logic level to a dummy cell on a dummy column adjacent the peripheral memory cell.

35. A method according to claim 34, further comprising:
reading a value from the peripheral memory cell; and
comparing the value to the written 0 or 1 logic level.

36. A method according to claim 34, wherein applying the stress voltage to the dummy cell starts after the writing of the peripheral memory cell.

37. A method according to claim 35, wherein reading the peripheral memory cell is performed during at least a portion of the application of the stress voltage to the dummy cell.

38. A method according to claim 34, wherein the memory cell comprises a capacitor having a plate electrode and a storage electrode separated by a dielectric, and a gateable channel electrically in series between the storage electrode and a bitline driver, and wherein writing comprises:
sourcing from the bitline driver an output voltage for writing the logic level;
enabling gateable channel for driving the storage electrode with the output voltage of the bitline driver; and
disabling the gateable channel.

39. A method according to claim 38, wherein the dummy cell comprises a gateable channel electrically in series between a dummy storage electrode and the stress voltage, and wherein applying the stress voltage to the dummy cell comprises enabling the dummy gateable channel.

40. A method according to claim 39, wherein the stress voltage is provided by a second bitline driver.

41. A method according to claim 39, wherein the stress voltage is the complement of the logic level.

42. A method of testing a memory device operable in a test mode comprising:
providing an array of memory cells arranged as a plurality of rows and columns, each memory cell comprising a capacitor, a bitline contact and an access transistor, a channel of the access transistor electrically coupled between the bitline contact and a storage electrode of the capacitor;
providing a plurality of conductive wordlines, each wordline corresponding to a row of memory cells and coupled to control nodes of the access transistors of its row;
providing a plurality of conductive bitlines, each bitline corresponding to a column of memory cells and coupled to the bitline contacts of the memory cells of its column;
providing a plurality of dummy cells outside the array and adjacent memory cells of an edge of the array;
writing data into memory cells at the edge of the array; and
applying, only during a test mode, one of three stress voltages selected from the group consisting of an upper voltage, an intermediate voltage, and a lower voltage to the plurality of dummy cells.

43. A method according to claim 42, further comprising:
reading the edge memory cells; and
comparing data read from the edge memory cells to the written data.

44. A method according to claim 43, wherein the edge memory cells are read after applying the stress voltage to the plurality of dummy cells.

45. A method according to claim 43, wherein the edge memory cells are read while applying the stress voltage to the plurality of dummy cells.

46. A method according to claim 42, wherein each dummy cell comprises a capacitor, and wherein applying the stress voltage comprises coupling the capacitors of the dummy cells to one of an upper and lower voltage bus.

47. A method according to claim 42, wherein the edge memory cells are contained within a peripheral column at a periphery of the plurality of columns.

48. A method according to claim 46, wherein the plurality of dummy cells further comprise gateable channels electrically connected between their respective capacitors and a digit line, and wherein coupling comprises:
coupling the digit line to one of the upper and lower voltage buses; and
enabling the gateable channels.

49. A method according to claim 48, wherein the gateable channels are coupled to a first set of alternating pairs of wordlines, wherein the access transistors of the edge memory cells are coupled to a second set of the alternating pairs of wordlines, and wherein the enabling of the gateable channels comprises configuring wordline drivers associated with the first set of wordlines to provide an enable signal to the gateable channels of the dummy cells.

50. A method according to claim 43, wherein reading comprises enabling an access transistor associated with a first memory cell of the edge memory cells.

51. A method according to claim 50, wherein reading further comprises enabling an access transistor associated with a second memory cell of the edge memory cells.

52. A method according to claim 51, wherein the second memory cell is read after reading the first memory cell.

53. A method according to claim 43, wherein reading is performed during application of the stress voltage.

54. A method according to claim 42, wherein the edge memory cells are contained within a peripheral row of the array of memory cells.

55. A method according to claim 54, wherein the plurality of dummy cells comprise a row of dummy cells, wherein bitline contacts of the row of dummy cells are coupled to a first set of alternating bitlines of the plurality of conductive bitlines, wherein the bitline contacts of the edge memory cells are coupled to a second set of alternating bitlines, and wherein applying the stress voltage comprises:
configuring bitline drivers associated with the first set of alternating bitlines to apply either an upper voltage or a lower voltage; and
enabling control nodes of gateable channels of the dummy cells.

56. A method according to claim 55, wherein writing the edge memory cells comprises:
configuring bitline drivers associated with the second set of alternating bitlines with the complement of the voltage applied by the first set of alternating bitlines; and enabling the access transistors of the edge memory cells to coupling the capacitors of the edge memory cells to the second set of alternating bitlines.

57. A method according to claim 56, wherein the edge memory cells are written before applying the stress voltage.

58. A method according to claim 54, wherein the plurality of dummy cells comprise a row of dummy cells, wherein bitline contacts of the row of dummy cells are coupled to a first set of alternating bitlines of the plurality of conductive bitlines, wherein the bitline contacts of the edge memory cells are coupled to a second set of alternating bitlines, further comprising:

enabling the access transistors of the peripheral row of edge memory cells to transfer the contents of the edge memory cells onto the second set of alternating bitlines.

59. A method according to claim 58, wherein the transfer onto the first set of alternating bitlines is performed during application of the stress voltage.

60. An integrated circuit, comprising:

an array of memory cells;

a column of dummy cells adjacent to a peripheral column in the array; and a selection circuit capable of providing one of two voltages to the dummy cell column.

61. The integrated circuit of claim 60, wherein the selection circuit is capable of providing one of three voltages to the dummy cell column.

62. A method for operating an integrated circuit, the integrated circuit comprising an array of memory cells and a column of dummy cells adjacent to a peripheral column in the array, the method comprising:

writing a first logic level into at least one memory cell on, the peripheral column; and biasing the dummy column to a second logic level complementary to the first logic level.

63. The method of claim 62, further comprising reading the at least one memory cell to produce a value, and comparing the value to the first logic level.

64. The method of claim 63, wherein the steps of reading and biasing occur at least in part simultaneously.

65. The method of claim 62, wherein biasing the dummy column further includes writing the second logic level into at least one dummy cell adjacent the at least one memory cell.

\* \* \* \* \*